United States Patent [19]
Howell et al.

[11] Patent Number: 5,375,597
[45] Date of Patent: Dec. 27, 1994

[54] DIGITAL MAGNETIC RESONANCE SHOCK-MONITORING METHOD

[76] Inventors: Jerome C. Howell, 7706 Scrapeshin Trail, Chattanooga, Tenn. 37421; Ronald P. Green, 2779 Wilson St., Carlsbad, Calif. 92008

[21] Appl. No.: 136,392

[22] Filed: Oct. 13, 1993

[51] Int. Cl.$^5$ ............................................. A61B 5/055
[52] U.S. Cl. ................................ 128/653.2; 128/653.5
[58] Field of Search ............... 128/653.1, 653.2, 653.5, 128/633; 324/307, 308

[56] References Cited

U.S. PATENT DOCUMENTS

| | | | |
|---|---|---|---|
| 4,452,250 | 6/1984 | Chance et al. | 324/311 |
| 4,633,181 | 12/1986 | Murphy-Boesch et al. | 324/318 |
| 4,984,574 | 1/1991 | Goldberg et al. | 128/653.2 |
| 5,072,732 | 12/1991 | Rapoport et al. | 128/653.2 |
| 5,159,929 | 11/1992 | Morris et al. | 128/633 |
| 5,190,039 | 3/1993 | Takeuchi et al. | 128/633 |

*Primary Examiner*—K. M. Pfaffle
*Attorney, Agent, or Firm*—Loyal M. Hanson

[57] ABSTRACT

A method for monitoring the pH of a patient includes the step of providing a magnetic resonance system having a magnet with a bore configured to receive a portion of a finger of a patient without receiving a substantially larger portion of the body of the patient. The method proceeds by inserting the finger of the patient into the bore of the magnet and monitoring the pH level of capillary bed tissue in the finger with the magnetic resonance system. Preferably, the system is configured to monitor the spectrum of phosphorus-31 metabolites in the finger and produce information in the form of a normalized phosphorous integral ratio indicative of the spectral area in order to alert an operator of the occurrence of a condition in which the normalized phosphorous integral ratio is greater than one in the setting of decreasing pH, as indicative of capillary bed tissue shock—lactic acidosis. In line with the above, a digital magnetic resonance system includes a superconducting magnet for producing a magnetic field for magnetic resonance monitoring purposes, and a control system operatively coupled to the magnet for cooperating with the magnet in order to produce and display magnetic resonance information related to the portion of the body of a patient. The magnetic has a bore for receiving a portion of the body of a patient, and the bore has a size sufficient to receive a portion of a linger of a patient without receiving a substantially larger portion of the body of the patient. Preferably, the magnet is sufficiently small to enable use in a conventional hospital operating room.

4 Claims, 4 Drawing Sheets

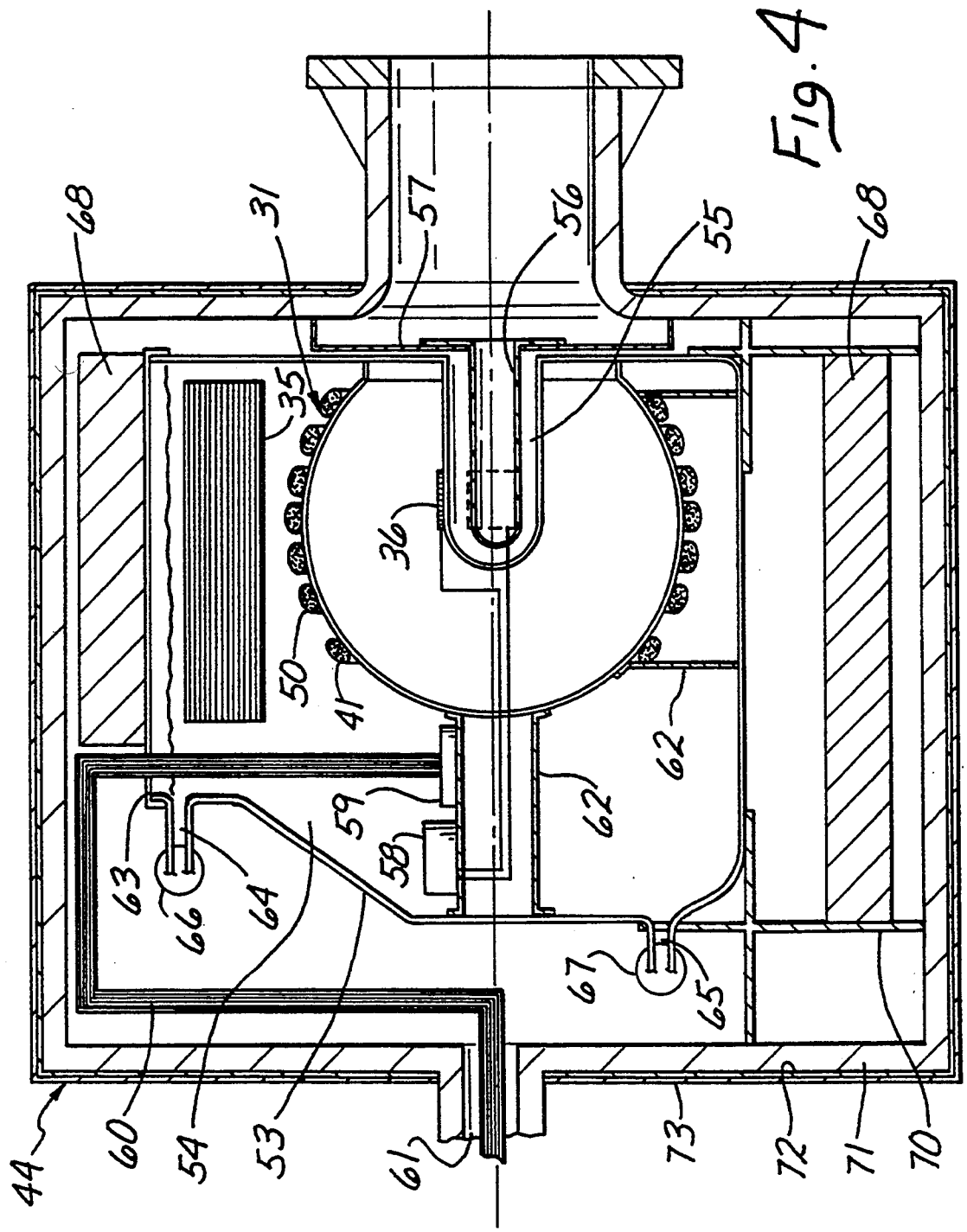

DIGITAL MAGNETIC RESONANCE SHOCK-MONITORING METHOD

BACKGROUND OF THE INVENTION

1. Technical Field

This invention relates generally to diagnostic medicine, and more particularly to a digital magnetic resonance (MR) method and system for patient monitoring and diagnosis.

2. Background Information

Recall that some magnetic resonance procedures (MRPs) place the patient directly into the bore of a very large superconducting magnet for diagnosis. The magnetic field within the bore produces an equilibrium condition amongst nuclei in the patient's body that brief pulses of radio frequency (RF) energy upset. The nuclei respond to the pulses by changing spin energy states and thereby producing weak RF signals at distinct resonant frequencies that computerized equipment detects and processes for the information conveyed.

Such MRPs proceed noninvasively and without harmful radiation effects, and patients appreciate the absence of needles, contrast agents, and radioisotopes. For many such reasons, MRPs, including magnetic resonance imaging (MRI) and magnetic resonance spectroscopy (MRS), continue to grow as valuable clinical and research tools. Details of existing technology appear abundantly in the literature. For further background material and examples, see the articles and references in the publication by Michael Brant-Zawadzki and David Norman entitled *Magnetic Resonance Imaging of the Central Nervous System* (published in 1987 by Raven Press Books, Library of Congress No. RC361.5.M34).

Of the various nuclei useful for MRPs, that of phosphorus-31 ($P_{31}$) attracts particular attention. Metabolites are present in vivo in the millimolar concentration range needed for convenient observation and they offer a wealth of information. Observed in a $P_{31}$ spectrum, various metabolites present an almost ideal picture of real-time processes or energy metabolism taking place in vivo. Further, the relative ratios of various metabolites serve as fingerprints in identifying various organs, tissues, disease states, and even aging. In addition, various ones help determine pH and others help measure the rates of bioenergetic reactions in vivo.

Thus, MRPs promise significant advantages over existing procedures in noninvasively and continuously measuring pH and detecting tissue normoxia and hypoxia. Existing procedures may involve arterial puncture and blood gas analysis, pulmonary artery catheterization and mixed venous $O_2$ saturation monitoring, and analysis of blood electrolytes and lactic acid level. Beyond the invasive nature of such procedures, pH is subject to change suddenly based on respiratory status, $O_2$ carrying capacity of blood, and tissue demand and perfusion. In addition, arterial sampling is expensive, potentially dangerous, and time consuming, making results irrelevant to the needs of a patient whose status is changing.

But various problems in existing MRPs need to be overcome to effectively use $P_{31}$ for noninvasive and continuous pit and bioenergetics monitoring. For example, the procedure of placing the patient in the bore of a large magnet can be a somewhat unusual and potentially claustrophobic experience. Many seriously ill patients are too unstable to be placed in a large magnet where they are inaccessible to immediate resuscitation. In addition, it may interfere with other procedures the clinician desires to undertake. Furthermore, the cost and complexity of the magnet may be prohibitive, and suitably large facilities to house the magnet and associated equipment may be unavailable. Thus, health care professionals need a better procedure and associated equipment to effectively use $P_{31}$ MRS for pH and bioenergetics monitoring.

SUMMARY OF THE INVENTION

This invention solves the problems outlined above by providing a magnetic resonance method and system for portable, noninvasive, and continuous monitoring that examines tissue within the finger of the patient. Such digital monitoring is accomplished with a much smaller magnet because no more than the finger need be placed in the bore. That eliminates the barrier to immediate resuscitation, the unusual and potentially claustrophobic experience of placing the entire patient within the bore, and the magnet cost, complexity, and size common to existing MRPs. Of course, the invention also overcomes the invasive nature and other disadvantages outlined above for existing invasive procedures. One embodiment of the invention focuses on the spectrum of $P_{31}$ nuclei of capillary bed tissue in the finger for pH and bioenergetics monitoring.

In terms of the claim language that is subsequently developed, a method for monitoring the pH of a patient includes the step of providing a magnetic resonance system having a magnet with a bore configured to receive a portion of a finger of a patient without receiving a substantially larger portion of the body of the patient. The method proceeds by inserting the finger of the patient into the bore of the magnet aria then monitoring the pH level of capillary bed tissue in the finger with the magnetic resonance system. The pH may be ascertained using techniques well known in MR $P_{31}$ spectroscopy. For further background material, see the reference by D. G. Gadian, "Nuclear Magnetic Resonance and Its Application to Living Systems," Oxford: Clarendon, 1982; pages 27-36.

The step of monitoring the pH level may include producing a normalized phosphorous integral ratio from the spectrum of phosphorous-31 metabolites in the finger. Numerical integration of the inorganic phosphorous curve Pi amplitude versus frequency obtained from MR $P_{31}$ spectra yields quantitative information about inorganic phosphorous. The system compares this quantitative information from various spectra to the pH of the tissue at the time of analysis. From this comparison, the system generates a phosphorous integral ratio (PI). PI compares the Pi curve area at the present pH with the area obtained at normal pH or pH nearest normal. PI is normalized to one. A PI greater than one in a setting of decreasing pH is a fingerprint for tissue shock—lactic acidosis.

In line with the above, a magnetic resonance system for monitoring the pH of a patient includes means in the form of a superconducting magnet for producing a magnetic field for magnetic resonance monitoring purposes, the magnet having a bore for receiving a portion of the body of a patient. The system also includes means in the form of a control system operatively coupled to the magnet for cooperating with the magnet in order to produce and display magnetic resonance information related to the portion of the body of a patient. The bore has a size sufficient to receive a portion of a finger of a patient without receiving a substantially larger portion of the body of the patient. Preferably, the magnet is sufficiently small to enable use in a conventional hospital operating room, and the control system may be configured to monitor the spectrum of phosphorous-31 metabolites in the finger.

The following illustrative drawings and detailed description make the foregoing and other objects, features, and advantages of the invention more apparent.

BRIEF DESCRIPTION OF THE DRAWINGS

FIG. 4 is a further enlarged cross sectional view of the magnet and shield components.

DESCRIPTION OF THE PREFERRED EMBODIMENTS

Figure 1:
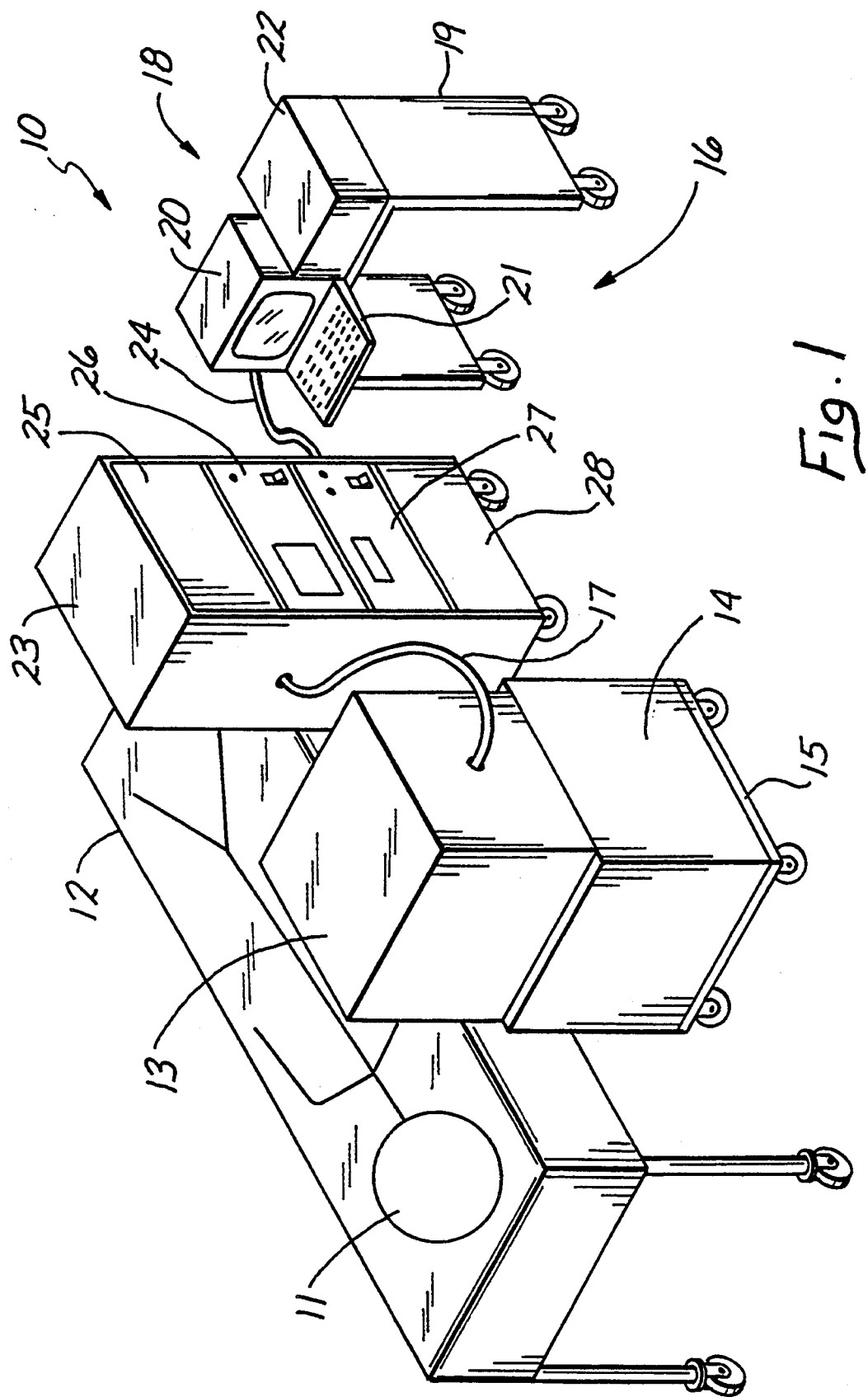
FIG. 1 of the drawings is a pictorial of a magnetic resonance system constructed according to the invention.

FIG. 1 of the drawings shows a magnetic resonance system 10 constructed according to the invention. It is used to monitor the pH of a patient 11 according to the method of the invention. The patient 11 (depicted by a stick figure) lies atop a conventional operating table 12 with a finger inserted in a magnetic resonance magnet-and-shield combination 13 which occupies a position adjacent the operating table 12 atop a cryogenic refrigeration unit 14 on a wheelable cart 15. A control system 16 operatively coupled to the magnet-and-shield combination 13 by suitable means (e.g., cabling 17), monitors the pH level of capillary bed tissue in the finger and communicates information to attending personnel.

The control system 16 includes a computer system 18 atop another wheelable cart 19. The computer system 18 may take the form of a commercially available 486 desktop computer, and it includes a display 20, a keyboard 21 and a printer 22. The control system 16 also includes additional components in a wheelable rack 23. They are coupled by suitable means (e.g., cabling 24) to the computer system 18 and they may include a spectrum display operating indicator manual control unit 25, a receiver synthesizer electronics unit 26, an RF transmitter unit 27, and a magnet power supply unit 28.

Thus, the system 10 is portable and so it enables portable MRPs according to the inventive method disclosed. The method for monitoring the pH of a patient includes the step of providing a magnetic resonance system having a superconducting magnet with a bore having a size sufficient to receive a portion of a finger of a patient without receiving a substantially larger portion of the body of the patient. The method proceeds by inserting the finger of the patient into the bore of the magnet, and monitoring the pH level of capillary bed tissue in the finger with the magnetic resonance system. Based upon the foregoing and subsequent descriptions, system components may be configured, interconnected, and programmed by one of ordinary skill in the art to perform magnetic resonance monitoring of the pH in the finger of the patient 11 according to the inventive aspects described.

Figure 2:
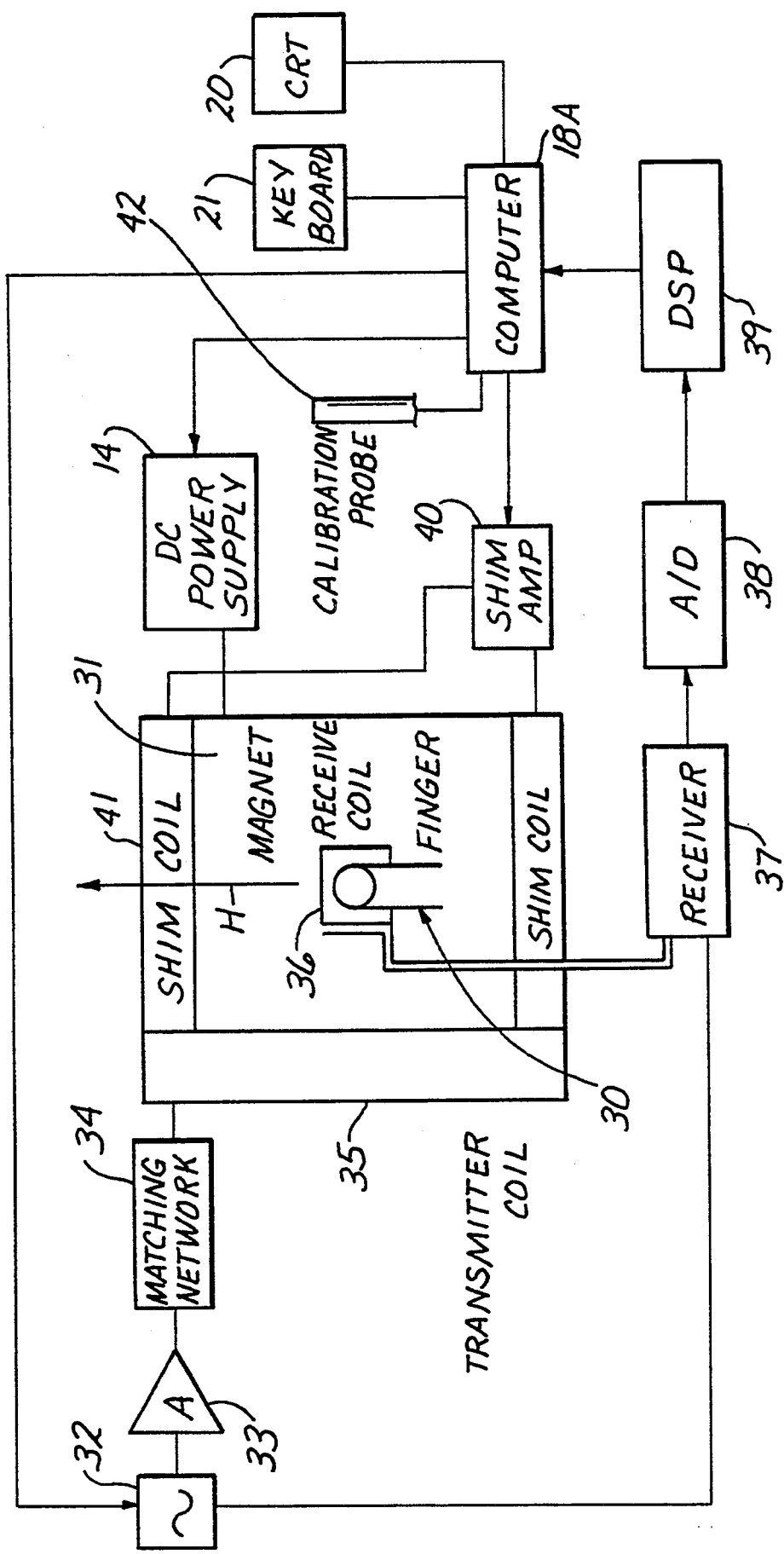
FIG. 2 is a block diagram of the system.

Further details of the system 10 are shown in block diagram form in FIG. 2. A finger 30 of the patient 11 (shown diagrammatically) is in position within a magnet 31 that is part of the magnetic-and-shield combination 13 of FIG. 1. The magnet 31 produces a static magnetic field (depicted in FIG. 2 by an arrow H) that results in an equilibrium condition amongst nuclei in the patient's body. Brief pulses of RF from a synthesizer/exciter unit 32 pass through an RF amplifier 33 and matching network 34 to an RF coil 35 (labelled a "transmitter coil"). The RF pulses upset the equilibrium condition and the nuclei respond by changing spin energy states. In doing so, they produce weak RF signals at distinct resonant frequencies that a receive coil 36 couples to a computer 18A (part of the computer system 18 in FIG. 1) via a receiver 37, an analog-to-digital converter 38, and a digital signal processing (DSP) unit 39.

The computer 18A using known techniques to process the output of the DSP unit 39 and provide information about the finger 30, specifically the pH of capillary bed tissue in the finger 30. That information is communicated to attending personnel in any of various ways, including computer displays, printers, and auxiliary spectrum display devices. In addition to overseeing those functions, the computer 18A proceeds in a known way to correct for small irregularities in the static magnetic field with a shim amplifier 40 and shim coils 41. A calibration probe 42 may be inserted into the magnet 31 in place of the finger 30 for calibration purposes.

Figure 3:
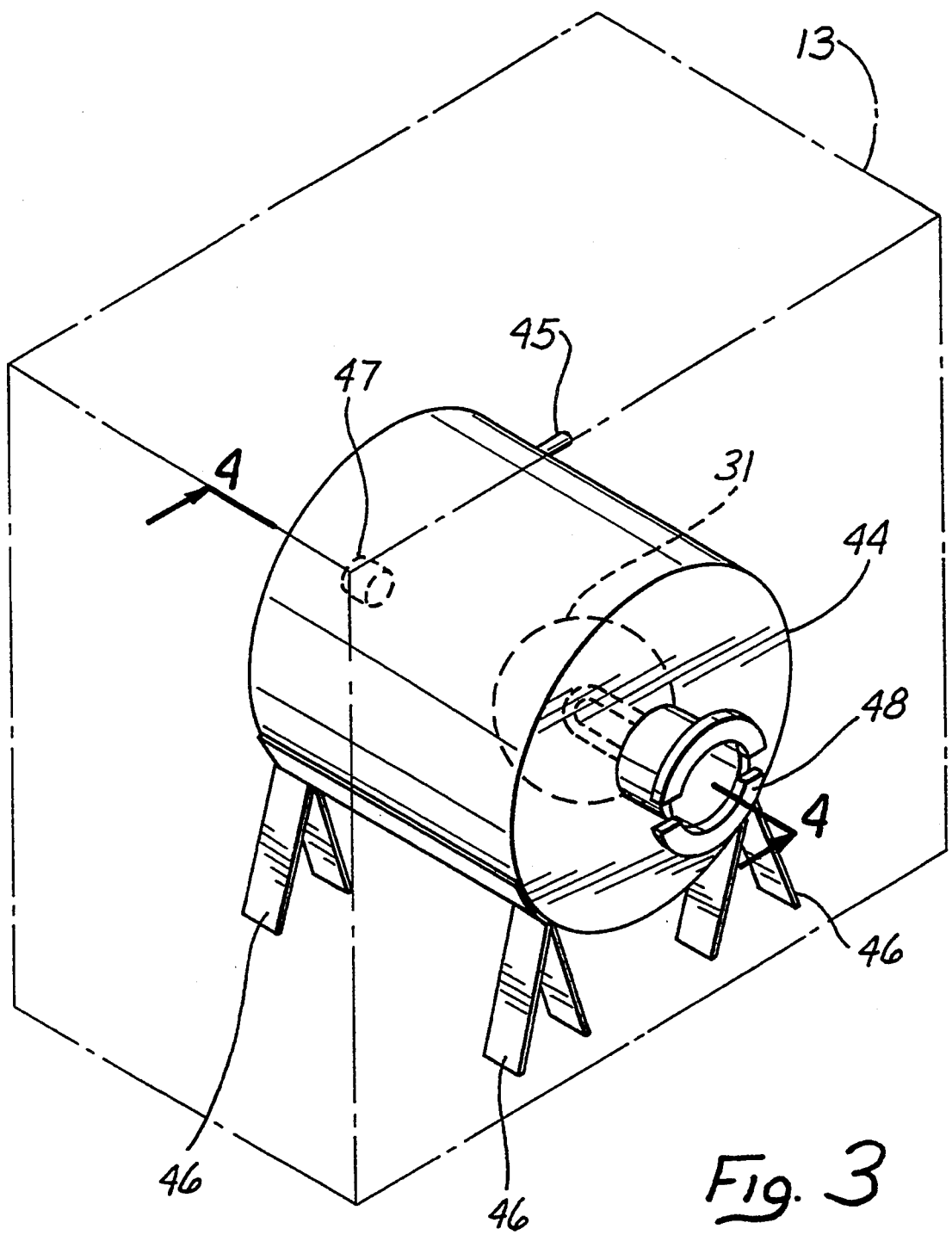
FIG. 3 is an enlarged diagrammatic representation of the magnet and shield components.

Further details of the magnet-and-shield combination 13 are shown in FIGS. 3 and 4. It includes the magnet 31 and associated components in a configuration having the approximate size of a washing machine. The container 13 houses a magnetic containment cylinder 44 that serves to contain the field produced by the magnet 31. The cylinder 44 is supported by braces 46 and connected to the cryogenic cooler 14 via hoses 45, only one of which is visible in FIG. 3. The cylinder 44 also has two access ports 47 and 48. Port 47 is the means whereby the electronic and electrical connections are made to the computer 18A in FIG. 2 and to the magnetic sensor system (i.e., the RF exciter unit 32, receiver 37, and associated componentry). Port 48 is where the patient's hand is placed so that a finger can be correctly oriented in the magnetic field produced by the magnet 31. The port 48 is sufficiently large to receive the patient's hand without receiving substantially more of the patient's body. To further confine the magnetic field, a field-trapping metal collar that is configured to fit closely over the patient's arm may be connected at the port 48.

FIG. 4 shows Further details in a cross sectional taken on line 4—4 of FIG. 3. The superconducting magnet 31 includes a dewar 53 within the cylinder 44. The dewar 53 contains cryogenic liquid 54 supplied from the cryogenic refrigeration unit 14 in FIG. 1. That arrangement maintains the superconducting state of high-temperature superconducting coil 50, the shim coil 41, the transmitter coil 35, the receive coil 36, and an RF matching network. Of course, a super conducting magnet achieved with higher temperature cryogenic techniques may be employed without departing from the broader inventive concepts disclosed.

The dewar 53 is fabricated from a nonmagnetic, nonconductive, low-thermal-expansive material that is shaped and dimensioned to define a bore 55. The bore 55 is configured to receive a portion of a finger of a patient without receiving a substantially larger portion of the body of the patient. Preferably, the bore is somewhat oversized and a finger guard 56 is included to hold the patient's finger in the center of the magnetic field produced by the magnet 31 and in correct position with respect to orthogonal receiving coils that are part of the receive coil 36. With the finger guard 56 mounted on the patient's finger, the finger guard and finger are inserted into the bore 55 until stopped by a bracket 57. As a further idea of bore size, it may measure about 1.5 inches in diameter and about 4.0 inches in length.

The high temperature superconducting coils 50 and shim coils 41 are wound on a perforated spherical structured fabricated from a nonmagnetic, nonconductive, low-thermal-expansive material (e.g., a carbon fiber composite). The coils 50 and 41 produce a static uniform magnetic field, and the transmitter coil 35 (also a high temperature superconductor) produces the correct RF pulse to spin the $P_{31}$ nuclei within the capillary bed tissue in the patient's finger. The orthogonally mounted high temperature superconducting receive coil 36 senses the signal produced by the decaying spin of the $P_{31}$ nuclei to provide magnetic resonance information about the patient.

An RF matching network 58 matches the impedance of the receive coil 36 to the receiver 37 in FIG. 2. Due to the low impedance of the receive coil 36, the matching network 58 also needs to be in a superconducting state. The matching network 58 may include a low noise amplifier to improve sensitivity. It may also include the transmitter matching network 34 previously described with reference to FIG. 2.

An electrical interface 59 interfaces the magnetic field coils 41 and 50 to associated componentry in the system via a cable harness 60 that is part of the cable 17 in FIG. 1. The cable harness 60 extends through a port 61 in the cylinder 44. Supports 62 hold the superconducting magnet 31 in place within the dewar 53. The lid 63 of the dewar 53 includes a small opening for the cable harness 60. The opening in the lid 63 also serves as a vent for the cryogenic liquid 54 within the dewar 53. A continuous flow of the cryogenic liquid 54 from the cryogenic refrigeration unit 14 in FIG. 1 is supplied through ports 64 and 65 extending through circular openings 66 and 67 in the cylinder 44.

To mask the effects of the magnetic shield on the transmitter coil 35 shown in FIG. 2, an RF load 68 is placed between the dewar 53 and the magnetic shield. The characteristics of the RF load 68 are such that it is lossy at the transmitter frequency while maintaining an impedance approximately that of free space.

The dewar 53 is supported within the magnetic shield by braces 70. The DC magnetic shield is typically made up of several layers. A first layer 71 in the form of a thick iron based primary cylindrical shield is backed by a highly electrically conductive second layer 72. The outer third layer 73 is a very high permeability material in order to trap any residual magnetic field that escapes sufficient combinations of the first two layers 71 and 72. By these technique, the intense magnetic field generated by the superconducting coils 41 and 50 are contained sufficiently in the multilevel magnetic shield to permit operation of the unit in a relatively uncontrolled magnetic environment such as a hospital environment.

From the foregoing description, one of ordinary skill in the art may implement the invention for portable, noninvasive, and continuous monitoring that examines tissue within the finger of the patient. It uses a much smaller magnet. It eliminates the barrier to immediate resuscitation, the unusual and potentially claustrophobic experience of placing the entire patient within the bore, and the magnet cost, complexity, and size common to existing MRPs. It avoids the need for specially constructed rooms for proper operation. One embodiment of the invention focuses on the spectrum of $P_{31}$ nuclei of capillary bed tissue in the finger for pH and bioenergetics monitoring, and known computer programming techniques may be used according to another aspect of the invention to produce information indicative of increasing phosphorous integral ratio (PI) in the setting of decreasing pH, a condition indicative of capillary bed tissue shock—lactic acidosis.

Although an exemplary embodiment has been shown and described, one of ordinary skill in the art may make many changes, modifications, and substitutions without necessarily departing from the spirit and scope of the invention. For example, the superconducting magnet may employ other high temperature superconducting material, including Bismuth-Strontium-Calcium-Copper-Oxide (BSCCO), in order to reduce the cooling requirements of the cryogenic refrigeration unit. In addition, a magnet constructed according to the invention may be used for other purposes without departing from the scope of the claims, including performing MRPs on specimens.

What is claimed is:

1. A method for real-time shock monitoring of a patient at risk of shock, comprising:
   providing a magnetic resonance system having a superconducting magnet with a bore configured to receive a portion of a finger of the patient without receiving a substantially larger portion of the body of the patient;
   inserting the finger of the patient into the bore of the magnet; and
   monitoring the pH level of capillary bed tissue in the finger with the magnetic resonance system in order to determine the occurrence of a shock condition in the patient.

2. A method as recited in claim 1, wherein the step of monitoring the pH level includes monitoring the spectrum of phosphorus-31 metabolites.

3. A method as recited in claim 2, wherein the step of monitoring the pH level includes producing information in the form of a normalized phosphorous integral ratio indicative of the spectral area of phosphorus-31 metabolites in order to alert an operator of the occurrence of a condition in which the normalized phosphorous integral ratio is greater than one in the setting of decreasing pH, as indicative of capillary bed tissue shock—lactic acidosis.

4. A digital magnetic resonance system, comprising:
   means in the form of a superconducting magnet for producing a magnetic field for magnetic resonance monitoring purposes, the magnet having a bore for receiving a portion of the body of a patient; and
   means in the form of a control system operatively coupled to the magnet for cooperating with the magnet in order to produce and display magnetic resonance information related to the portion of the body of the patient;
   wherein the bore has a size sufficient to receive a portion of a finger of the patient without receiving a substantially larger portion of the body of the patient;
   wherein the control system includes means for monitoring the pH level of capillary bed tissue in the finger in order to alert an operator of the occurrence of a shock condition in the patient; and
   wherein the system includes means for producing a normalized phosphorus integral ratio from the spectrum of phosphorus-31 metabolites in order to alert an operator of the occurrence of a condition in which the normalized phosphorus integral ratio is greater than one in the setting of decreasing pH, as indicative of capillary bed tissue shock—systemic shock.

* * * * *